(12) United States Patent
Hill et al.

(10) Patent No.: US 10,785,076 B2
(45) Date of Patent: *Sep. 22, 2020

(54) METHOD AND APPARATUS FOR GENERATING OFDM SIGNALS

(71) Applicant: Telefonaktiebolaget LM Ericsson (publ), Stockholm (SE)

(72) Inventors: Johan Hill, Lund (SE); Michael Breschel, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 16/519,979

(22) Filed: Jul. 23, 2019

(65) Prior Publication Data

US 2019/0349231 A1  Nov. 14, 2019

Related U.S. Application Data

(63) Continuation of application No. 15/963,507, filed on Apr. 26, 2018, now Pat. No. 10,425,263, which is a
(Continued)

(51) Int. Cl.
*H04L 27/26* (2006.01)
*H04L 5/00* (2006.01)
(Continued)

(52) U.S. Cl.
CPC ........ *H04L 27/2607* (2013.01); *H04L 5/0037* (2013.01); *H03M 1/004* (2013.01); *H03M 1/66* (2013.01)

(58) Field of Classification Search
CPC .......... H03M 1/00; H03M 1/004; H03M 1/02; H03M 1/66; H03M 5/00; H03M 7/00;
(Continued)

(56) References Cited

U.S. PATENT DOCUMENTS 7,573,944 B2  8/2009  Chang et al.
8,487,795 B1  7/2013  Jiang et al.
(Continued)

FOREIGN PATENT DOCUMENTS

RU  2369030 C2  9/2009
WO  9703509 A1  1/1997
(Continued)

OTHER PUBLICATIONS

3GPP, "Discussion on downlink NB-IOT solutions", 3GPP TSG RAN WG1 Meeting #82bis, R1-155896, Malmo, Sweden, Oct. 5-9, 2015, pp. 1-4.
(Continued)

*Primary Examiner* — Siu M Lee
(74) *Attorney, Agent, or Firm* — Murphy, Bilak & Homiller, PLLC (57) ABSTRACT

A method in a transmitter circuit of generating a signal comprising a first sequence of OFDM symbols, which are to be transmitted within a frequency sub band of a second sequence of OFDM symbols is disclosed. A first cyclic prefix (CP) of the second sequence of OFDM symbols has a first duration, and a second CP of the second sequence of OFDM symbols has a second duration. In order to generate both the first and the second cyclic prefix with an integer number of equidistant samples, a first sampling rate is required. The method comprises generating the signal comprising the first sequence of OFDM symbols at a second sampling rate, lower than the first sampling rate, and adjusting a sampling phase during CPs.

17 Claims, 4 Drawing Sheets

Related U.S. Application Data continuation of application No. 15/503,882, filed as application No. PCT/EP2017/051857 on Jan. 27, 2017, now Pat. No. 9,998,313.

(60) Provisional application No. 62/295,358, filed on Feb. 15, 2016.

(51) Int. Cl.
*H03M 1/00* (2006.01)
*H03M 1/66* (2006.01)

(58) Field of Classification Search
CPC ... H04L 5/00; H04L 5/02; H04L 27/26; H04L 27/32
USPC .......................................... 375/259, 260, 295
See application file for complete search history.

(56) References Cited

U.S. PATENT DOCUMENTS

| | | | |
|---|---|---|---|
| 9,998,313 B2* | 6/2018 | Hill | .................. H04L 5/0037 |
| 10,425,263 B2* | 9/2019 | Hill | .................. H04L 27/2607 |
| 2004/0184551 A1 | 9/2004 | Liu et al. | |
| 2005/0084025 A1 | 4/2005 | Chen | |
| 2007/0064839 A1 | 3/2007 | Luu et al. | |
| 2007/0274416 A1 | 11/2007 | Ishii | |
| 2008/0123592 A1 | 5/2008 | Popovic | |
| 2008/0292027 A1 | 11/2008 | Liu et al. | |
| 2010/0260276 A1 | 10/2010 | Orlik et al. | |
| 2014/0256277 A1 | 9/2014 | Ki et al. | |
| 2015/0139190 A1 | 5/2015 | Patel et al. | |
| 2015/0181575 A1* | 6/2015 | Ng | .................. H04L 5/0092 370/329 |
| 2016/0149743 A1* | 5/2016 | Rong | .................. H04B 7/0452 370/329 |
| 2017/0033887 A1* | 2/2017 | Lei | .................. H04W 4/70 |
| 2017/0093606 A1 | 3/2017 | Dutronc et al. | |
| 2017/0238344 A1 | 8/2017 | McGowan et al. | |
| 2018/0123845 A1 | 5/2018 | Hill et al. | |
| 2019/0013913 A1 | 1/2019 | Suzuki et al. | |
| 2019/0349231 A1 | 11/2019 | Hill et al. | |

FOREIGN PATENT DOCUMENTS

| | | |
|---|---|---|
| WO | 2017013533 A1 | 1/2017 |
| WO | 2017018966 A1 | 2/2017 |
| WO | 2017108111 A1 | 6/2017 |

OTHER PUBLICATIONS

3GPP, "In-band operation for NB-IOT", 3GPP TSG-RAN WG1 Meeting #82bis, R1-155980, Malmö, Sweden, Oct. 5-9, 2015, pp. 1-4.

Unknown, Author , "Analysis of Uplink Transmit Timing in NB-IoT", Ericsson, 3GPP TSG RAN WG4 Meeting #78bis, R4-161945, San Jose del Cabo, Mexico, Apr. 11-15, 2016, pp. 1-7.

Unknown, Author , "Narrow band OFDMA based proposal for GERAN Cellular IoT", 3GPP TSG GERAN #64, Tdoc GP-140839, San Francisco, USA, Qualcomm Incorporated, Nov. 17-21, 2014, pp. 1-17.

Unknown, Author , "NB M2M—Overview of the Physical Layer Design", 3GPP TSG GERAN #63, GP-140563, Ljubljana, Slovenia, Huawei Technologies Co., Ltd. , HiSilicon Technologies Co., Ltd., Aug. 25-29, 2014, pp. 1-12.

Unknown, Author , "NB-CIoT—Introduction", 3GPP GERAN Adhoc#3 on FS_IoT_LC, GPC-150389, Neul Ltd, u-blox AG, Huawei Technologies Co., Ltd., HiSilicon Technologies Co., Ltd, Qualcomm Incorporated, Jun. 29-Jul. 2, 2015, pp. 1-5.

Unknown, Author , "On device complexity for NB-IoT", Intel Corporation, 3GPP TSG RAN WG1 Meeting #83, R1-156524, Anaheim, USA, Nov. 16-20, 2015, pp. 1-10.

Unknown, Author , "On DL Tone Spacing for Standalone Operation", Qualcomm Incorporated, 3GPP TSG RAN WGl #83, R1-157065, Anaheim, USA, Nov. 15-22, 2015, pp. 1-7.

Huang, Hao, "A 6-GS/s 6-bit Time Interleaved SAR-ADC", Proceedings of the 8th European Microwave Integrated Circuits Conference, Nuremberg, Germany, Oct. 6-8, 2013, 37-40.

Unknown, Author, "Analysis of UE RF transceiver architecture for NB-IoT", 3GPP TSG.RAN WG4 Meeting #77 NB-IOT AH, R4-77AH-IoT-0002, Budapest, Hungary, Jan. 20-22, 2016, 1-4.

Unknown, Author, "NB-IOT—downlink physical layer concept description", 3GPP TSG RAN WG1 Meeting #83, R1-156462, Anaheim, USA, Nov. 15-22, 2015, 1-11.

Unknown, Author, "NB-IoT—Synchronization Channel Evaluations", Ericsson, 3GPP TSG-RAN WG1 NB-IOT AdHoc, R1-160080, Budapest, Hungary, Jan. 18-22, 2016, 1-6.

* cited by examiner

METHOD AND APPARATUS FOR GENERATING OFDM SIGNALS

RELATED APPLICATIONS

This application is a continuation of U.S. patent application Ser. No. 15/963,507, filed 26 Apr. 2018, which is a continuation of U.S. patent application Ser. No. 15/503,882, filed 14 Feb. 2017, which is a national stage entry under 35 U.S.C. § 371 of international patent application serial no. PCT/EP2017/051857, filed 27 Jan. 2017, which claims priority to U.S. provisional application Ser. No. 62/295,358, filed 15 Feb. 2016. The entire contents of each of the foregoing applications is incorporated herein by reference.

TECHNICAL FIELD

The present disclosure relates to an OFDM transmitter and a related method.

BACKGROUND

Intercommunication between machines and communication between machines and humans, Machine type communication (MTC), are growing in importance. The networks of devices exchanging information are constantly growing in importance and builds up the Internet of Things (IoT). Cellular technologies adopted for these particular MTC applications are being developed and have an important role within IoT. The requirements on keeping cost and power consumption low are tough at the same time as coverage needs to be extended. All these aspects need to be addressed when designing for the future access technologies of IoT. 3GPP (3rd Generation Partnership Project) is currently investigating how to meet these design objectives and several proposals are up for discussion. The current studies have recently been moved from GERAN to RAN and have the commonality that they all have much lower system bandwidth compared to LTE (Long-Term Evolution) of today. All these so called "Clean slate" solutions target system bandwidth of around 200 kHz to enable deployment in former GSM spectrum and on existing GSM sites.

One proposal is called NB IoT (Narrowband IoT). It should be noted that NB IoT was initially referred to as NB LTE in early standardization, but was later renamed to NB IoT. Other solutions are referred to as Narrowband (NB) M2M, and NB OFDMA. Also a merged solution called NB CIoT (cellular IoT) with NB M2M uplink and NB OFDMA downlink has been proposed.

One feature of NB IoT is in-band operation, i.e., NB IoT can be deployed by puncturing LTE subcarriers one physical resource block (PRB) wide and use it for NB IoT transmission. To enable this in-band operation, it is important to synthesize the NB IoT numerologies with legacy LTE to avoid mutual interference between NB IoT and legacy LTE. In particular, NB IoT is supposed to keep LTE time-domain structure including orthogonal frequency-division multiplexing (OFDM) symbol duration and cyclic prefix (CP) duration. A straight forward solution is to reuse the sample rate to system bandwidth relation of LTE, i.e. 1.92 MHz, 3.84 MHz, 7.68 MHz, 15.36 MHz, 23.04 MHz, and 30.72 MHz sample rate related to 1.4 MHz, 3, 5 MHz, 10 MHz, 15 MHz, 20 MHz LTE channel bandwidths.

SUMMARY

The inventors have developed an approach for obtaining signal generation at a relatively low sampling rate in NB IoT and similar systems.

According to a first aspect, there is provided a method in a transmitter circuit of generating a signal comprising a first sequence of an integer number $N_{sym}$ of OFDM symbols, which are to be transmitted within a frequency sub band of a second sequence of $N_{sym}$ OFDM symbols. The first sequence of OFDM symbols and the second sequence of OFDM symbols are to be transmitted with the same timing. A first cyclic prefix of the second sequence of OFDM symbols has a first duration. A second cyclic prefix of the second sequence of OFDM symbols has a second duration. The second duration is shorter than the first duration, such that in order to generate both the first and the second cyclic prefix with an integer number of equidistant samples, a first sampling rate is required. The method comprises generating the signal comprising the first sequence of OFDM symbols at a second sampling rate, lower than the first sampling rate. The method further comprises adjusting a sampling phase during cyclic prefixes.

According to some embodiments, a subcarrier spacing of the OFDM symbols of the first and second sequences of OFDM symbols are 15 kHz, the first duration is 160/30.72 µs and the second duration is 144/30.72 µs.

According to some embodiments, the first sampling rate is 1.92 MHz.

According to some embodiments, OFDM symbols of the first sequence of OFDM symbols have 12 subcarriers.

According to some embodiments, the first cyclic prefix is an initial cyclic prefix of the second sequence of OFDM symbols, and all subsequent cyclic prefixes of the second sequence of OFDM symbols has the second duration.

According to some embodiments, the second sequence of OFDM symbols are transmitted in a Third-Generation Partnership Project (3GPP) Long-term Evolution (LTE) system and corresponds to a slot.

The first sequence of OFDM symbols may be transmitted in an NB IoT system.

According to some embodiments, the second sampling rate is 240 kHz.

According to some embodiments, the second sampling rate is 480 kHz.

According to some embodiments, the second sampling rate is 960 kHz.

According to some embodiments, adjusting the sampling phase comprises setting an initial sample instant during an OFDM symbol to occur a non-integer multiple of periods at the second sampling rate after a final sample instant of a preceding OFDM symbol.

According to a second aspect, there is provided a transmitter circuit for generating a signal comprising a first sequence of an integer number $N_{sym}$ of OFDM symbols, which are to be transmitted within a frequency sub band of a second sequence of $N_{sym}$ OFDM symbols. The first sequence of OFDM symbols and the second sequence of OFDM symbols are to be transmitted with the same timing. A first cyclic prefix of the second sequence of OFDM symbols has a first duration. A second cyclic prefix of the second sequence of OFDM symbols has a second duration. The second duration is shorter than the first duration, such that in order to generate both the first and the second cyclic prefix with an integer number of equidistant samples, a first sampling rate is required. The transmitter circuit comprises a digital-to-analog converter configured to generate the signal comprising the first sequence of OFDM symbols at a second sampling rate, lower than the first sampling rate. The transmitter circuit also comprises a control unit configured to adjust a sampling phase of the digital-to-analog converter during cyclic prefixes.

According to some embodiments, a subcarrier spacing of the OFDM symbols of the first and second sequences of OFDM symbols are 15 kHz, the first duration is 160/30.72 μs and the second duration is 144/30.72 μs.

According to some embodiments, the first sampling rate is 1.92 MHz.

According to some embodiments, OFDM symbols of the first sequence of OFDM symbols have 12 subcarriers.

According to some embodiments, the first cyclic prefix is an initial cyclic prefix of the second sequence of OFDM symbols, and all subsequent cyclic prefixes of the second sequence of OFDM symbols has the second duration.

According to some embodiments, the second sequence of OFDM symbols are transmitted in a Third-Generation Partnership Project, 3GPP, long term evolution, LTE, system and corresponds to a slot.

The first sequence of OFDM symbols may be transmitted in an NB IoT system.

According to some embodiments, the second sampling rate is 240 kHz.

According to some embodiments, the second sampling rate is 480 kHz.

According to some embodiments, the second sampling rate is 960 kHz.

According to some embodiments, the control unit is configured to adjust the sampling phase by setting an initial sample instant during an OFDM symbol to occur a non-integer multiple of periods at the second sampling rate after a final sample instant of a preceding OFDM symbol.

According to a third aspect, there is provided an electronic device comprising the transmitter circuit according to the second aspect. The electronic device may e.g. be an MTC device or a network node for a cellular communication system.

BRIEF DESCRIPTION OF THE DRAWINGS

Further objects, features and advantages of examples of the disclosure will appear from the following detailed description, reference being made to the accompanying drawings, in which.

DETAILED DESCRIPTION

One challenge for NB IoT is to be able to reuse the legacy LTE sampling rate relationship to system BW (bandwidth). There will not be an integer number of samples per cyclic prefix symbol if scaling is applied just related to required number of samples per symbol. One solution is to is to perform a straight forward upsampling/downsampling to the LTE lowest sampling rate of LTE, 1.92 MHz, and do the CP removal and addition respectively. The inventors have realized that this may be too expensive for low cost MTC devices, since it requires more device processing and consumes more power with decreased battery life and increased chipset cost as consequence. It is crucial with low cost and low power for a many MTC applications and desirable to be able to reduce the sampling rate for the complete NB IoT system and not only partly.

This disclosure proposes a transmitter architecture for keeping complete system sampling rate as low as possible and avoid any up-sampling to higher clock frequency for CP addition. According to examples, a digital-to-analog converter (DAC) is configured with non-uniform sampling triggered when cyclic prefix is to be transmitted.

Although the cost of NB IoT eNodeB (i.e. on the network side) is of less concern than on the device side, the proposed transmit chains can also be used at the eNodeB to reduce cost wherever necessary.

One beneficial feature of NB IoT is the in-band operation with legacy LTE. This makes it preferred to more or less use the LTE numerology. Subcarrier spacing is 15 kHz and CP length 160/30.72 microseconds for first OFDM symbol of every slot and 144/30.72 microseconds for the other. The lowest required sampling rate applicable for an integer number of samples per CP, for both CP lengths, is 1.92 MHz. At 1.92 MHz, the CP of the first OFDM symbol would be represented with 10 samples, and the CP of the other OFDM symbols would be represented with 9 samples each.

In this disclosure, an architecture, suitable for NB IoT, is proposed to further reduce the sample rate compared with the 1.92 MHz mentioned above. The UE (User Equipment) is more cost sensitive than the eNodeB and the focus therefore is on the UE side. However, the disclosed ideas are applicable also on the eNodeB side.

NB IoT is used as an example system in this disclosure, but the disclosure may be applied in other similar systems as well. Considerations of a transmitter design are presented below in terms of an example.

The useful bandwidth of NB IoT is 180 kHz even when it is deployed within a wide LTE carrier. Therefore, it is enough to have 180 kHz sample rate to satisfy the Nyquist sampling theorem. From a computational complexity point of view, it is beneficial to use an FFT or IFFT with a number of points that is an integer power of 2. Assuming that NB-LTE will have 12 subcarriers, each having 15 kHz bandwidth, the FFT/IFFT size of the uplink can be 16 ($=2^4$) points to minimize computational complexity. 16-point FFT and 15 kHz bandwidth for each subcarrier results in 240 kHz sample rate.

Figure 1:
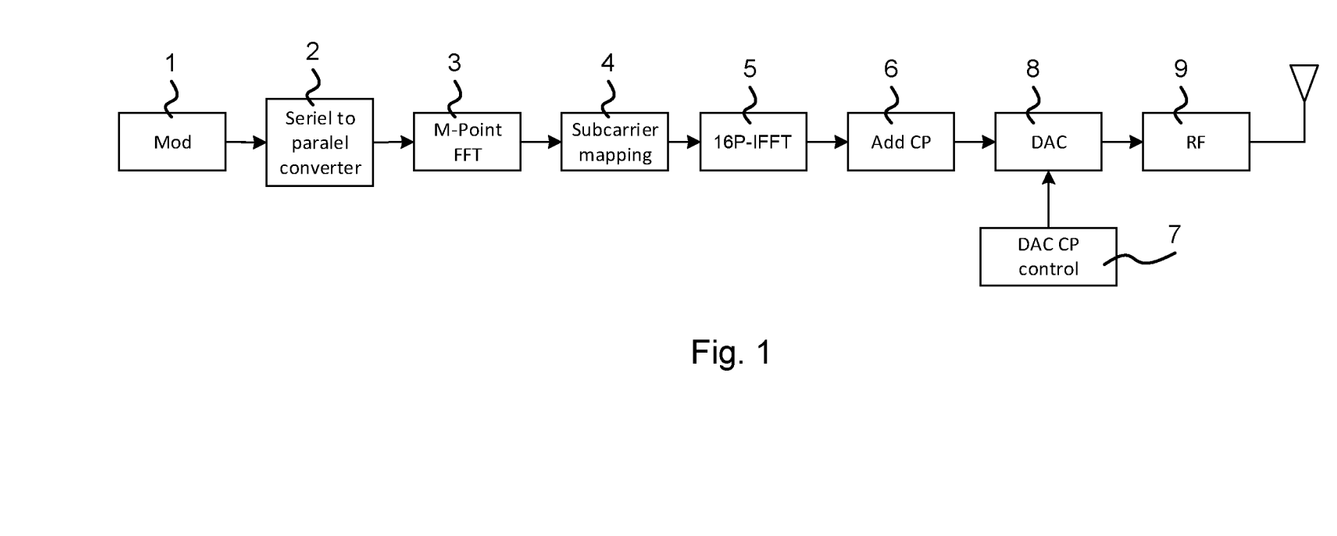
FIG. 1 illustrates functional blocks of a transmitter.

FIG. 1 is a functional block diagram that illustrates an example of a transmitter chain to facilitate the understanding of embodiments described herein. Use of a 240 kHz sample rate is assumed in the description of FIG. 1, but it should be remembered that other sample rates, also lower than 1.92 MHz, may also be used.

Modulator 1: This functional block is the modulator as in any communication system. Its maps input bit stream to constellation symbols.

Serial to parallel converter 2: This functional block formats input serial time-domain symbols into blocks, each of length M, where M is an integer.

M-point FFT 3: This functional block converts each M parallel time-domain symbols to M frequency-domain symbols.

Subcarrier mapping 4: This functional block maps each M frequency-domain symbols to the specified subcarriers for transmission.

16-point IFFT 5: This functional block converts the mapped symbols on the 16 subcarriers back to time domain.

CP adder 6: Since the signal has 240 kHz sampling rate every first OFDM symbol of each slot have a CP of 10/8 samples and the rest of the OFDM symbols 9/8 samples. The CP adder selects one CP sample that is the best estimate of cyclic prefix. An example of this is given with reference to FIG. 2 below.

Figure 2:
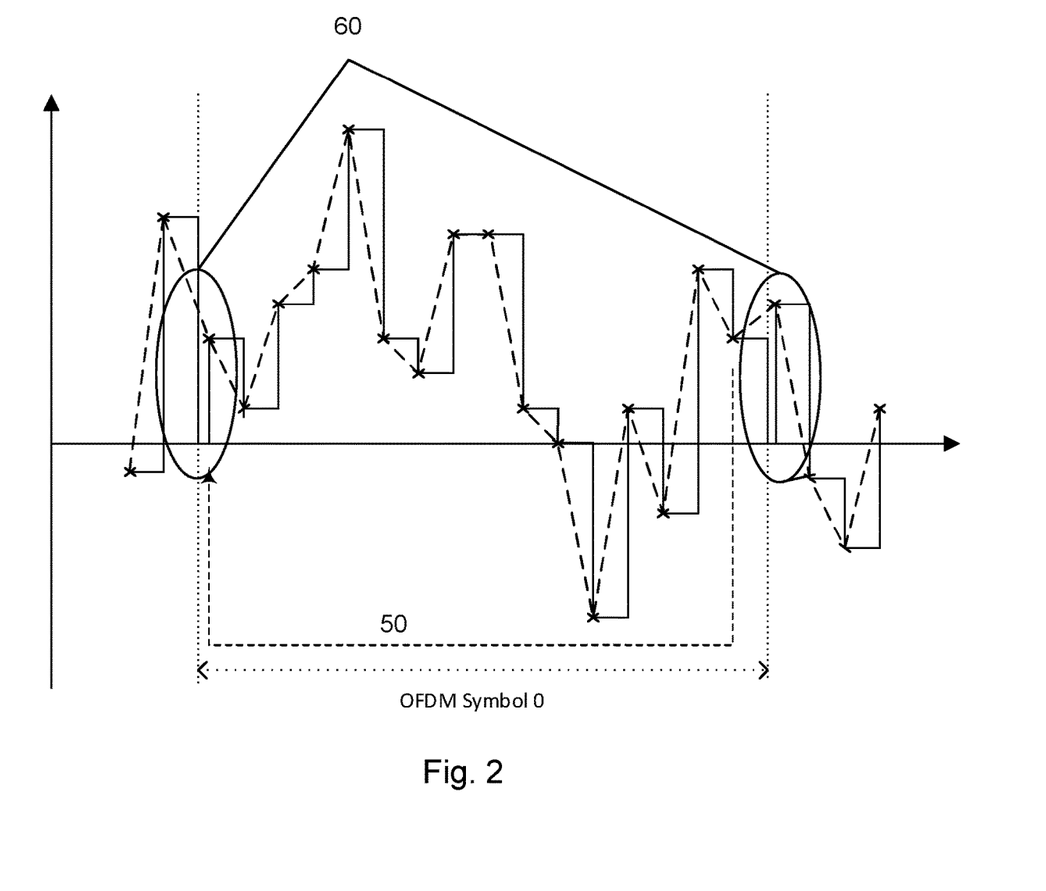
FIG. 2 illustrates the output of a digital to analog converter.

DAC CP control 7: This functional block controls the signal conversion of the DAC. When a CP is to be digital to analog converted it holds the signal 10/8 times longer or 9/8 times longer than normal or doing any other interpolation like e.g. put signal to 0 for 2/8 respectively ⅛ of time and let reconstruction filter adopt to have a continuous signal, as illustrated in FIG. 2. In other words, the DAC CP control unit 7 is thus configured to adjust a sampling phase of the digital-to-analog converter (DAC, described below) during cyclic prefixes.

DAC 8: Converts digital signal to analog signal and filters the output signal for reconstruction. DAC 8 has functionality to support non-uniform sampling controlled by the cyclic prefix insertion of the DAC CP control 7, in order to enable the adjustment of the sampling phase during the cyclic prefixes. DAC 8 can be of any known type, e.g. sigma-delta DAC or Nyquist DAC. The functionality to support non-uniform sampling may e.g. be achieved by providing a sampling clock signal width adjustable phase to the DAC 8. For example, a clock-signal generator may be configured to generate a plurality of sampling clock signals running at the same frequency (e.g. 240 kHz) with a phase delays between the different sampling clock signals. Adjusting the sampling phase may thus be obtained by selecting which of the sampling clock signals is currently provided to the DAC 8. Other solutions, such as using a phase-locked loop (PLL) with adjustable phase, may be used as well.

RF unit 9: Up-converts the signal to RF for transmission.

FIG. 2 illustrates an example output waveform for the DAC 8. If the sample rate of the DAC 8 is denoted $f_s$, the corresponding period time T is $1/f_s$. The center part of FIG. 2 illustrates OFDM symbol 0, i.e. the first OFDM symbol of a slot. A copy of the last sample of the symbol is selected as the single sample CP according to this example, as indicated by the dashed arrow 50. As an example, a zero with length 2/8 T is inserted in order to account for the varying CP length, which is 10/8 T in the first symbol. For the other symbols of the slot, the length of the zero is 1/8 T, for which the CP length is 9/8 T. Theses inserted zeroes, which are inserted just before the cyclic prefixes in the example, are indicated by reference sign 60 in FIG. 2. The discussion above assumes that f=240 kHz. For other sampling rates, which are equivalent to other values of T, the numbers would be different. For example, for a 480 kHz sampling rate, which means the T is half of that for 240 kHz, the inserted zeroes would be of lengths 2/4 T (first symbol) and 1/4 T (other symbols). Similarly, for a 960 kHz sample rate, which means that T is half of that for 480 kHz, the inserted zeroes would be of lengths 2/2 T (first symbol) and 1/2 T (other symbols). Furthermore, higher sampling rates than 240 kHz enables the use of more than a single sample CP. For example, for 480 kHz, a copy of the two last samples of the symbol may be used in the CP, and for 960 kHz, a copy of the four last samples of the symbol may be used in the CP. The disclosure is not limited to the above example of generating the signal values for the CP. The important point for enabling reducing the sampling rate (e.g. below 1.92 MHz in the NB IoT example considered herein) is the adjustment of the sampling phase during the cyclic prefix. In the example in FIG. 2, this sampling phase adjustment is obtained by delaying the first sampling instant in the symbol by 2/8 T (for the first symbol in the slot) or 1/8 T (for the other symbols in the slot). Delaying in this context should be interpreted as compared with if no sampling phase adjustment had been made. The sampling instances are indicated with crosses on the dashed line in FIG. 2. For a 480 kHz sampling rate, the sampling phase adjustment may be obtained by the first sampling instant in the symbol by 2/4 T (for the first symbol in the slot) or 1/4 T (for the other symbols in the slot). For a 960 kHz sampling rate, the sampling phase adjustment may be obtained by the first sampling instant in the symbol by 2/2 T (for the first symbol in the slot) or 1/2 T (for the other symbols in the slot).

Figure 3:
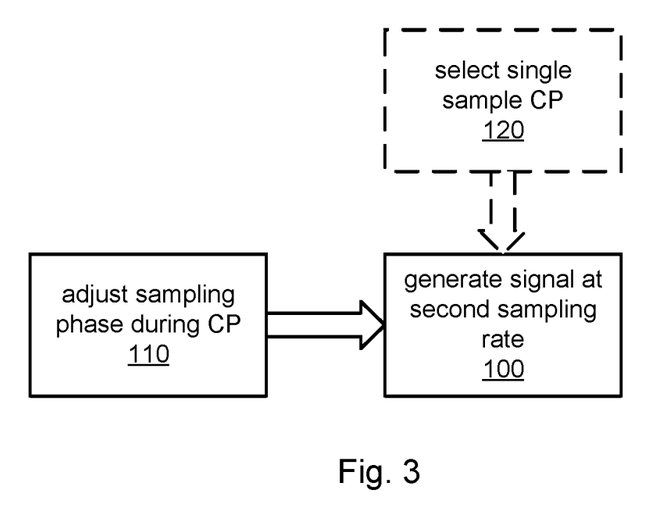
FIG. 3 illustrates a method.

In accordance with the disclosure above, FIG. 3 illustrates a method in a transmitter circuit of generating a signal comprising a first sequence of an integer number $N_{sym}$ of OFDM symbols, which are to be transmitted within a frequency sub band of a second sequence of $N_{sym}$ OFDM symbols. The first sequence of OFDM symbols and the second sequence of OFDM symbols are to be transmitted with the same timing. A first cyclic prefix of the second sequence of OFDM symbols has a first duration, or "length". A second cyclic prefix of the second sequence of OFDM symbols has a second duration, or "length". The second duration is shorter than the first duration, such that in order to generate both the first and the second cyclic prefix with an integer number of equidistant (i.e. uniformly spaced) samples, a first sampling rate is required. Thus, the first sampling rate is the minimum required sampling rate needed in order to generate both the first and the second cyclic prefix with an integer number of equidistant samples. Higher sampling rates, such as integer multiples of the first sampling rate, may of course also be used for generating both the first and the second cyclic prefix with an integer number of equidistant samples. For example, the second sequence of OFDM symbols may be transmitted in a Third-Generation Partnership Project (3GPP) Long-Term Evolution (LTE) system and correspond to a slot. In that context, the first sequence of OFDM symbols may be the OFDM symbols in corresponding slot of the NB IoT system used as an example herein. As discussed above, the first sampling rate may be 1.92 MHz. The method illustrated in FIG. 3 comprises generating 100 the signal comprising the first sequence of OFDM symbols at a second sampling rate, lower than the first sampling rate. As discussed above, the second sampling rate may e.g. be 240 kHz. However, other sampling rates lower than 1.92 MHz may also be beneficially used, such as but not limited to 480 kHz, or 960 kHz. A benefit of 240 kHz, 480 kHz, and 960 kHz is that these sample rates result in FFT and IFFT processing with the number of points being an integer power of two, which is advantageous in terms of computational complexity as mentioned above. The method illustrated in FIG. 3 also comprises adjusting 110 a sampling phase during cyclic prefixes. Thereby, a lower sampling rate than the first sampling rate can be used despite that the cyclic prefixes have lengths which are non-integer multiples of the period at the second sampling frequency.

In some examples, in line with what has been described above with reference to NB IoT, a subcarrier spacing of the OFDM symbols of the first and second sequences of OFDM symbols are 15 kHz, the first duration is 160/30.72 μs and the second duration is 144/30.72 μs. In some examples, also in line with what has been described above with reference to NB IoT, OFDM symbols of the first sequence of OFDM symbols have 12 subcarriers.

In some examples, also in line with what has been described above with reference to NB IoT, the first cyclic prefix is an initial cyclic prefix of the second sequence of OFDM symbols, and all subsequent cyclic prefixes of the second sequence of OFDM symbols has the second duration.

Adjusting the sampling phase may comprise setting an initial sample instant during an OFDM symbol to occur a non-integer multiple of periods at the second sampling rate after a final sample instant of a preceding OFDM symbol, e.g. as illustrated in FIG. 2.

Optionally, the method illustrated in FIG. 3 may comprise selecting 120 a single sample value as a cyclic prefix for each OFDM symbol. Alternatively, this may be performed in a separate process. As illustrated in FIG. 2, the single sample value may be selected equal to the final sample value of the OFDM symbol. As mentioned above, more than one sample may be used for the cyclic prefix depending on the value of the second sampling rate.

Figure 4:
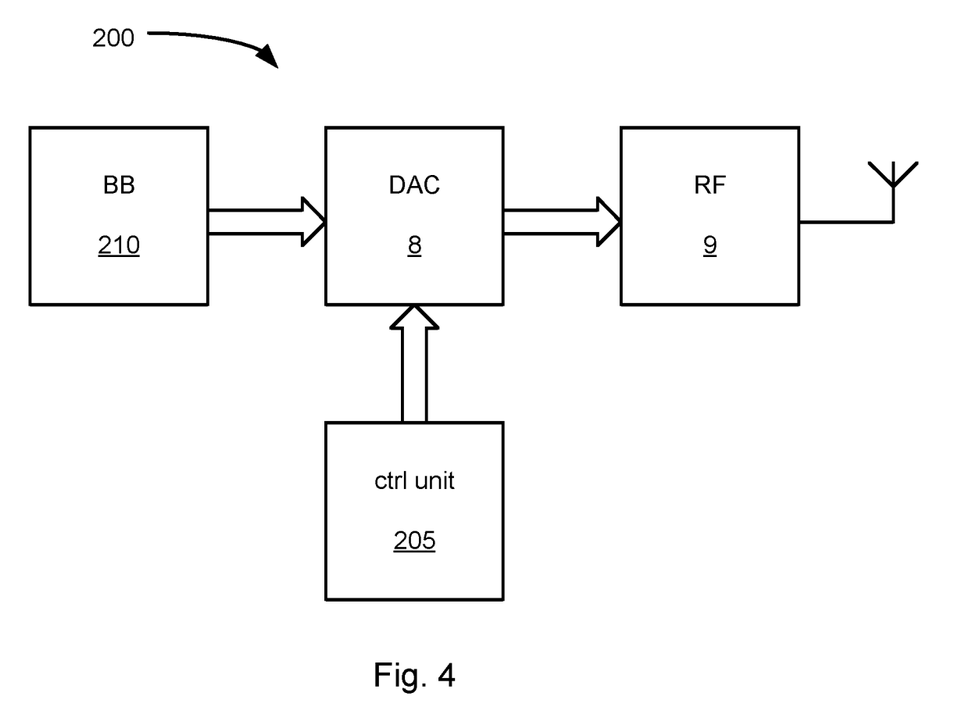
FIG. 4 is a block diagram of a transmitter.

Also in accordance with the disclosure above, FIG. 4 illustrates a transmitter circuit 200 for generating a signal comprising a first sequence of an integer number $N_{sym}$ of OFDM symbols, which are to be transmitted within a frequency sub band of a second sequence of $N_{sym}$ OFDM symbols. The first sequence of OFDM symbols and the second sequence of OFDM symbols are to be transmitted with the same timing. A first cyclic prefix of the second sequence of OFDM symbols has a first duration, or "length." A second cyclic prefix of the second sequence of OFDM symbols has a second duration, or "length". The second duration is shorter than the first duration, such that in order to generate both the first and the second cyclic prefix with an integer number of equidistant samples, a first sampling rate is required. For example, the second sequence of OFDM symbols may be transmitted in a 3GPP LTE system and correspond to a slot. In that context, the first sequence of OFDM symbols may be the OFDM symbols in corresponding slot of the NB IoT system used as an example herein. As discussed above, the first sampling rate may be 1.92 MHz. The transmitter circuit 200 illustrated in FIG. 4 comprises a DAC 8 configured to generate the signal comprising the first sequence of OFDM symbols at a second sampling rate, lower than the first sampling rate. This DAC corresponds to the DAC in FIG. 1, and therefore the same reference number 8 is used in both figures. As discussed above, the second sampling rate may e.g. be 240 kHz. However, other sampling rates lower than 1.92 MHz may also be beneficially used, such as but not limited to 480 kHz, or 960 kHz.

Furthermore, the transmitter circuit 200 illustrated in FIG. 4 comprises a control unit 205 configured to adjust a sampling phase of the DAC 8 during cyclic prefixes. Thereby, a lower sampling rate than the first sampling rate can be used despite that the cyclic prefixes have lengths which are non-integer multiples of the period at the second sampling frequency. Thus, the control unit 205 may be configured to perform the function of the functional unit 7 in FIG. 8. In some examples, the control unit 205 may also be adapted to select a single sample value as a cyclic prefix for each OFDM symbol. Thus, the control unit 205 may be configured to perform the function of functional unit 6 in FIG. 1. Alternatively, this may be performed in some other unit. As illustrated in FIG. 2, the single sample value may be selected equal to the final sample value of the OFDM symbol. As mentioned above, more than one sample may be used for the cyclic prefix depending on the value of the second sampling rate.

In some examples, in line with what has been described above with reference to NB IoT, a subcarrier spacing of the OFDM symbols of the first and second sequences of OFDM symbols are 15 kHz, the first duration is 160/30.72 µs and the second duration is 144/30.72 µs. In some examples, also in line with what has been described above with reference to NB IoT, OFDM symbols of the first sequence of OFDM symbols have 12 subcarriers.

In some examples, also in line with what has been described above with reference to NB IoT, the first cyclic prefix is an initial cyclic prefix of the second sequence of OFDM symbols, and all subsequent cyclic prefixes of the second sequence of OFDM symbols has the second duration.

The control unit 205 may be configured to adjust the sampling phase by setting an initial sample instant during an OFDM symbol to occur a non-integer multiple of periods at the second sampling rate after a final sample instant of a preceding OFDM symbol, e.g. as illustrated in FIG. 2.

As illustrated in FIG. 4, the transmitter circuit 200 may comprise an RF unit 9, e.g. corresponding to the RF unit 9 in FIG. 1. Furthermore, the transmitter 200 may comprise a baseband (BB) unit 210. The BB unit 210 may e.g. be configured to perform the functions of functional units 1-5 in FIG. 1. In some examples, the BB unit 210 may be configured to perform the function of functional unit 6 in FIG. 1, i.e. to select the sample value of the cyclic prefix. In some examples, the BB unit 210 and the control unit 205 may be implemented in the same hardware unit. In other examples, they may be implemented as separate different hardware units. Said hardware units may be application specific hardware units, programmable hardware units, or any combination thereof.

It should be noted that it is the first sequence of OFDM symbols that is to be transmitted by the transmitter circuit 200. The second sequence of OFDM symbols may be transmitted by one or more transmitters, e.g. in one or more other devices. However, the first and the second sequences of OFDM symbols have the same timing to facilitate coexistence.

Figure 5:
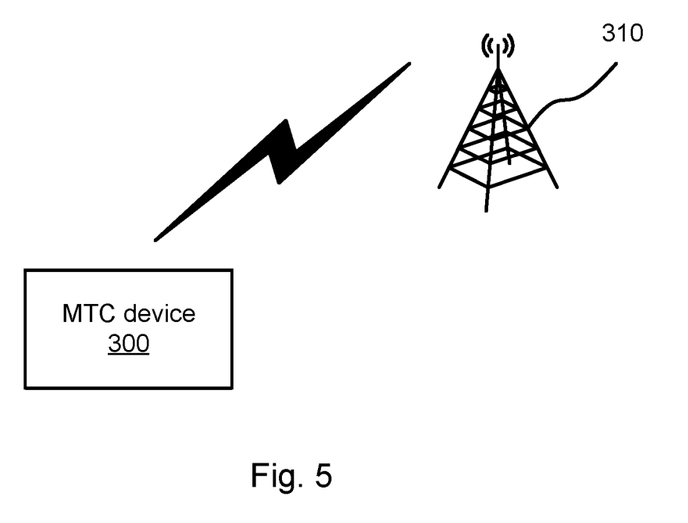
FIG. 5 illustrates a communication environment.

FIG. 5 illustrates an environment wherein the method and transmitter circuit disclosed herein can be employed. In FIG. 5, a machine-type communication (MTC) device 300 communicates wirelessly with a network node 310 of a cellular communication system. The communication may take place, for example, using NB IoT as described above. The network node 310 may thus be an eNodeB for NB IoT, according to some examples. The MTC device 300 and the network node 310 are nonlimiting examples of electronic devices that may comprise the transmitter circuit 200.

The present disclosure has been presented above with reference to specific examples. However, other implementations than the above described are possible. Different method steps than those described above, performing the method by hardware or software, may be provided. The different features and steps of the examples may be combined in other combinations than those described. For example, the transmitter does not have to be partitioned exactly as the functional block diagram in FIG. 1.

The invention claimed is:

1. A method in a transmitter circuit of generating a signal comprising a sequence of an integer number of OFDM symbols, for transmission in a frequency sub band, wherein the method comprises:
    generating the signal comprising the sequence of OFDM symbols at a sampling rate of 240 kHz;
    adjusting a sampling phase during cyclic prefixes of the OFDM symbols.

2. The method of claim 1, wherein a first cyclic prefix for one or more of the sequence of OFDM symbols has a duration of 160/30.72 µs, a second cyclic prefix for one or more of the sequence of OFDM symbols has a second duration of 144/30.72 µs, and a subcarrier spacing of the OFDM symbols of the sequence of OFDM symbols is 15 kHz.

3. The method of claim 1, wherein a first cyclic prefix for one or more of the sequence of OFDM symbols has a first duration, a second cyclic prefix for one or more of the sequence of OFDM symbols has a second duration, and the second duration is shorter than the first duration, such that in order to generate both the first and the second cyclic prefix with an integer number of equidistant samples, a first sampling rate of 1.92 MHz would be required.

4. The method of claim 3, wherein the first cyclic prefix is an initial cyclic prefix of the sequence of OFDM symbols, and all subsequent cyclic prefixes of the sequence of OFDM symbols have the second duration.

5. The method of claim 4, wherein OFDM symbols of the sequence of OFDM symbols have 12 subcarriers.

6. The method of claim 5, wherein the sequence of OFDM symbols is transmitted in a Third-Generation Partnership Project (3GPP) Narrow-Band Internet-of-Things (NB-IOT) system and corresponds to a slot.

7. The method of claim 1, wherein adjusting the sampling phase comprises setting an initial sample instant during an OFDM symbol to occur a non-integer multiple of periods at the sampling rate after a final sample instant of a preceding OFDM symbol.

8. A transmitter circuit for generating a signal comprising a sequence of an integer number of OFDM symbols, for transmission in a frequency sub band, wherein the transmitter circuit comprises
a digital-to-analog converter configured to generate the signal comprising the sequence of OFDM symbols at a sampling rate of 240 kHz; and
a control circuit configured to adjust a sampling phase of the digital-to-analog converter during cyclic prefixes of the OFDM symbols.

9. The transmitter circuit of claim 8, wherein a first cyclic prefix for one or more of the sequence of OFDM symbols has a duration of 160/30.72 µs, a second cyclic prefix for one or more of the sequence of OFDM symbols has a second duration of 144/30.72 µs, and a subcarrier spacing of the OFDM symbols of the sequence of OFDM symbols is 15 kHz.

10. The transmitter circuit of claim 8, wherein a first cyclic prefix for one or more of the sequence of OFDM symbols has a first duration, a second cyclic prefix for one or more of the sequence of OFDM symbols has a second duration, and the second duration is shorter than the first duration, such that in order to generate both the first and the second cyclic prefix with an integer number of equidistant samples, a first sampling rate of 1.92 MHz would be required.

11. The transmitter circuit of claim 10, wherein the first cyclic prefix is an initial cyclic prefix of the sequence of OFDM symbols, and all subsequent cyclic prefixes of the sequence of OFDM symbols have the second duration.

12. The transmitter circuit of claim 11, wherein OFDM symbols of the sequence of OFDM symbols have 12 subcarriers.

13. The transmitter circuit of claim 12, wherein the transmitter is configured to transmit the sequence of OFDM symbols in a Third-Generation Partnership Project (3GPP) Narrow-Band Internet-of-Things (NB-IOT) system, the sequence of OFDM symbols corresponding to a slot.

14. The transmitter circuit of claim 8, wherein adjusting the sampling phase comprises setting an initial sample instant during an OFDM symbol to occur a non-integer multiple of periods at the sampling rate after a final sample instant of a preceding OFDM symbol.

15. An electronic device comprising the transmitter circuit of claim 8.

16. The electronic device of claim 15, wherein the electronic device is a machine-type communication (MTC) device.

17. The electronic device of claim 15, wherein the electronic device is a network node for a cellular communication system.

* * * * *

UNITED STATES PATENT AND TRADEMARK OFFICE
CERTIFICATE OF CORRECTION

PATENT NO. : 10,785,076 B2
APPLICATION NO. : 16/519979
DATED : September 22, 2020
INVENTOR(S) : Hill et al.

Page 1 of 1

It is certified that error appears in the above-identified patent and that said Letters Patent is hereby corrected as shown below:

In the Specification

In Column 5, Line 40, delete "f=240" and insert -- $f_s$=240 --, therefor.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*